(12) United States Patent
Homma et al.

(10) Patent No.: US 8,158,949 B2
(45) Date of Patent: Apr. 17, 2012

(54) RADIATION DETECTOR AND METHOD FOR MANUFACTURING THE SAME

(75) Inventors: Katsuhisa Homma, Kuki (JP); Shinetsu Fujieda, Kawasaki (JP)

(73) Assignee: Toshiba Electron Tubes & Devices Co., Ltd., Tochigi-Ken (JP)

( * ) Notice: Subject to any disclaimer, the term of this patent is extended or adjusted under 35 U.S.C. 154(b) by 150 days.

(21) Appl. No.: 12/692,902

(22) Filed: Jan. 25, 2010

(65) Prior Publication Data
US 2010/0116997 A1    May 13, 2010

Related U.S. Application Data

(63) Continuation of application No. PCT/JP2008/063292, filed on Jul. 24, 2008.

(30) Foreign Application Priority Data

Jul. 26, 2007    (JP) .................................. 2007-194590

(51) Int. Cl.
*G01T 1/20* (2006.01)
(52) U.S. Cl. ................ 250/368; 250/370.11; 250/370.12
(58) Field of Classification Search ................... 250/368
See application file for complete search history.

(56) References Cited

U.S. PATENT DOCUMENTS

| | | | | |
|---|---|---|---|---|
| 4,687,683 | A * | 8/1987 | Ishii et al. | 427/160 |
| 6,614,180 | B1 * | 9/2003 | Francke et al. | 313/527 |
| 2007/0045554 | A1 * | 3/2007 | Wakamatsu et al. | 250/370.11 |
| 2008/0067393 | A1 * | 3/2008 | Metzger et al. | 250/370.11 |

FOREIGN PATENT DOCUMENTS

| | | |
|---|---|---|
| JP | 05-19060 | 1/1993 |
| JP | 2005-283483 | 10/2005 |
| JP | 2007-033452 | 2/2007 |

OTHER PUBLICATIONS

Korean Office Action dated Jul. 28, 2011.

\* cited by examiner

*Primary Examiner* — David Porta
*Assistant Examiner* — Hugh H Maupin
(74) *Attorney, Agent, or Firm* — Pillsbury Winthrop Shaw Pittman, LLP

(57) ABSTRACT

A radiation detector characterized by includes a photoelectric conversion element, a scintillation layer which converts radioactive rays to fluorescence, the scintillation layer being formed on the photoelectric conversion element, and a reflective film formed on the scintillation layer, the reflective film containing light-scattering particles for reflecting the fluorescence from the scintillation layer and a binder material binding the light-scattering particles, and having depletion portions without being filled with the binder material, the depletion portions being formed in a periphery of the light-scattering particles.

11 Claims, 18 Drawing Sheets

| Content percentage (volume)% of depletion portions (spaces) | 3 | 9 | 17 | 25 | 32 |
|---|---|---|---|---|---|
| CTF (2Lp/mm) % | 28 | 30 | 34 | 41 | 49 |
F I G. 3
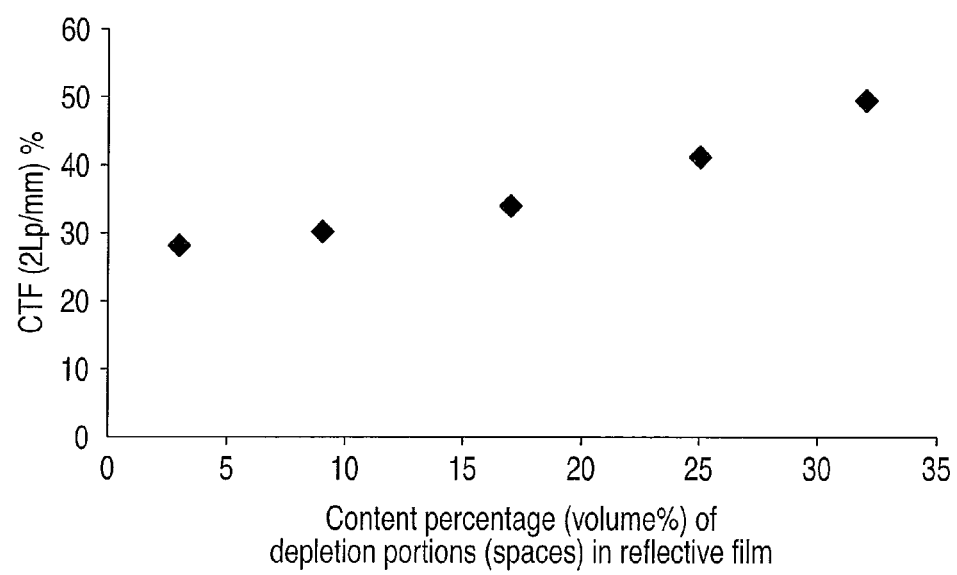
F I G. 4

| TiO₂ volume content percentage | 20 | 40 | 60 | 70 | 80 | 90 |
|---|---|---|---|---|---|---|
| CTF (2Lp/mm) % | 29 | 30 | 33 | 38 | 43 | 46 |
F I G. 11
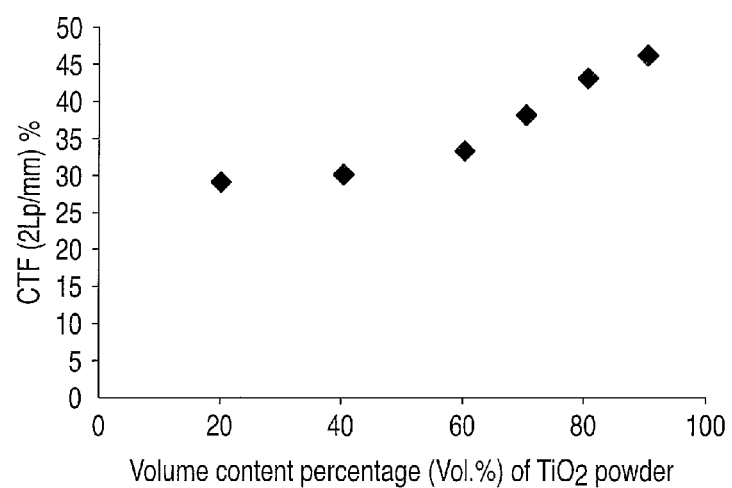
F I G. 12
| Al₂O₃ volume content percentage | 20 | 40 | 60 | 70 | 80 | 90 |
|---|---|---|---|---|---|---|
| CTF (2Lp/mm) % | 27 | 28 | 30 | 36 | 40 | 42 |
F I G. 13

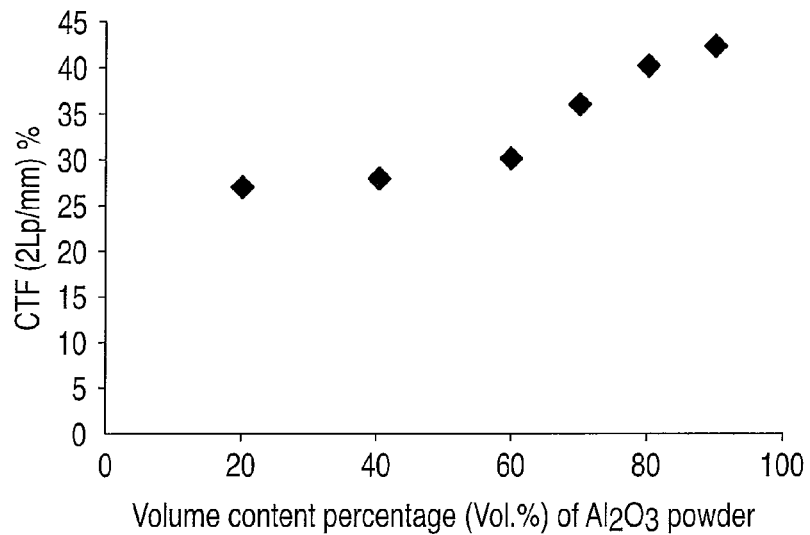
FIG. 14
| SiO2 volume content percentage | 20 | 40 | 60 | 70 | 80 | 90 |
|---|---|---|---|---|---|---|
| CTF (2Lp/mm) % | 26 | 27 | 30 | 34 | 37 | 39 |
FIG. 15
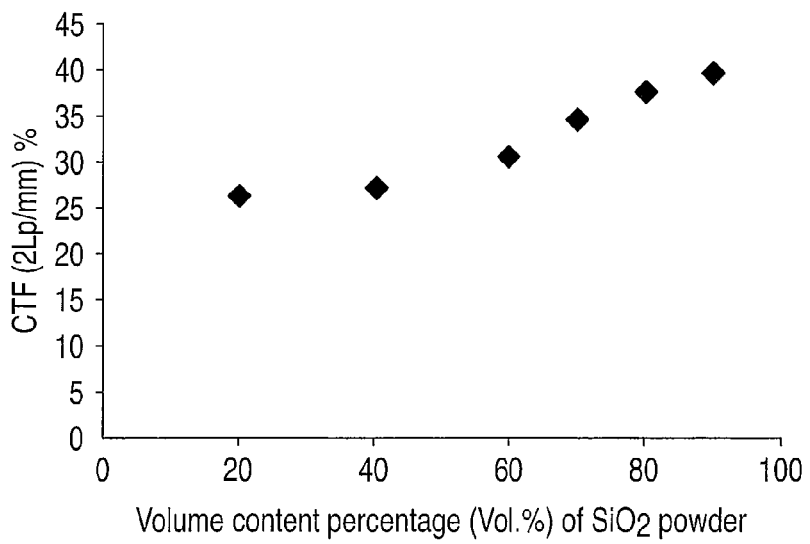
FIG. 16

| | | CTF (2Lp/mm) | Mechanical and thermal reliability |
|---|---|---|---|
| Present example | TiO2 content percentage 90wt.% film (50 μm) /TiO2 content ratio 50wt.% film (50 μm) /CsI:Tl film (50 μm) | 45% | ○ |
| Comparative example 1 | TiO2 content ratio 90wt.% film (100 μm) /CsI:Tl film (600 μm) | 46% | × |
| Comparative example 2 | TiO2 content ratio 50wt.% film (100 μm) /CsI:Tl film (600 μm) | 38% | ○ |

| Average size of light-scattering particle ($\mu$m) | 0.2 | 0.5 | 1 | 2 | 5 | 10 | 20 |
|---|---|---|---|---|---|---|---|
| Volume filling factor (%) | 70 | 70 | 70 | 70 | 70 | 70 | 70 |
| Film thickness ($\mu$m) | 50 | 50 | 50 | 50 | 50 | 50 | 50 |
| (Size of light-scattering particle/volume filling factor)/film thickness | 0.005714 | 0.014286 | 0.028571 | 0.057143 | 0.142857 | 0.285714 | 0.571429 |
| CTF (2Lp/mm) % binder material (1) | 45 | 43 | 40 | 36 | 32 | 31 | 31 |
| CTF (2Lp/mm) % binder material (2) | 43 | 41 | 38 | 34 | 30 | 29 | 29 |
| CTF (2Lp/mm) % binder material (3) | 44 | 42 | 39 | 35 | 31 | 30 | 30 |
| CTF (2Lp/mm) % binder material (4) | 44 | 42 | 40 | 36 | 30 | 29 | 30 |

| TiO2 average particle size (μm) | 0.2 | 0.5 | 1 | 2 | 5 | 10 | 20 |
|---|---|---|---|---|---|---|---|
| CsI:TI film pillar pitch (μm) | 8 | 8 | 8 | 8 | 8 | 8 | 8 |
| TiO2 particle size/pillar pitch | 0.025 | 0.0625 | 0.125 | 0.25 | 0.625 | 1.25 | 2.5 |
| CsI:TI film pillar pitch : approx. 6μm | 48 | 47 | 44 | 38 | 35 | 34 | 33 |
| CsI:TI film pillar pitch : approx. 8μm | 46 | 44 | 41 | 35 | 32 | 31 | 31 |
| CsI:TI film pillar pitch : approx. 12μm | 44 | 41 | 37 | 31 | 29 | 28 | 27 |
| CsI:TI film pillar pitch : approx. 16μm | 40 | 37 | 34 | 29 | 25 | 24 | 24 |
F I G. 21
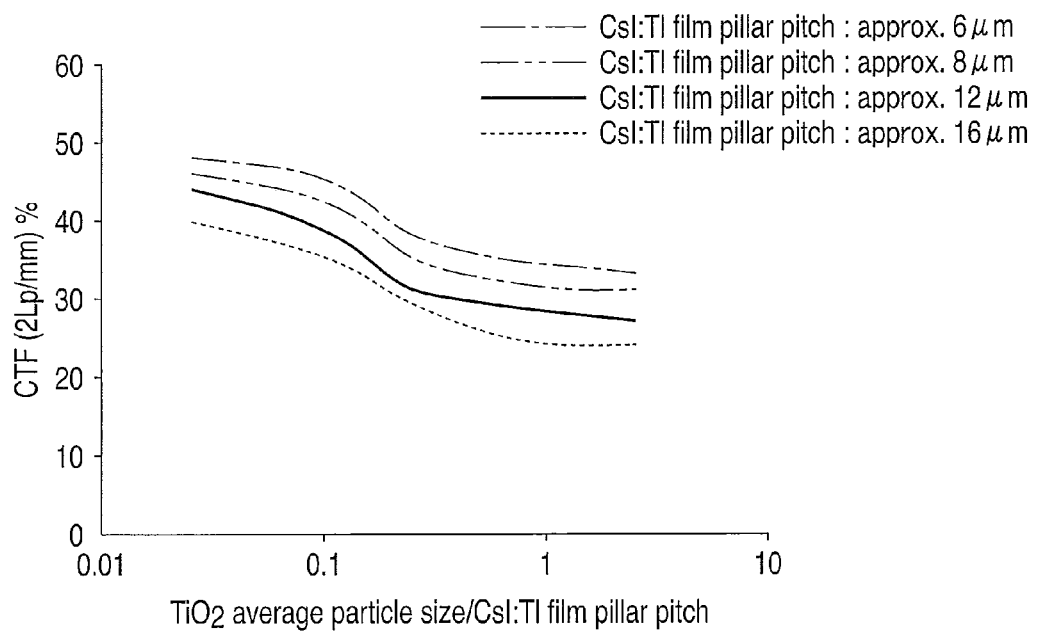
F I G. 22

| Reflective film thickness/pixel pitch | 0.2 | 0.5 | 1 | 2 | 3 |
|---|---|---|---|---|---|
| TiO₂-base reflective film | 52 | 48 | 44 | 41 | 40 |
| SiO₂-base reflective film | 48 | 46 | 42 | 39 | 38 |
| TiO₂-base reflective film  pixel pitch 150μm | 44.7 | 41.3 | 37.8 | 35.3 | 34.4 |
| SiO₂-base reflective film  pixel pitch 150μm | 41.3 | 39.6 | 36.1 | 33.5 | 32.7 |
| TiO₂-base reflective film  pixel pitch 300μm | 24.0 | 23.0 | 21.0 | 19.5 | 19.0 |
| SiO₂-base reflective film  pixel pitch 300μm | 22.4 | 20.6 | 18.9 | 17.6 | 17.2 |

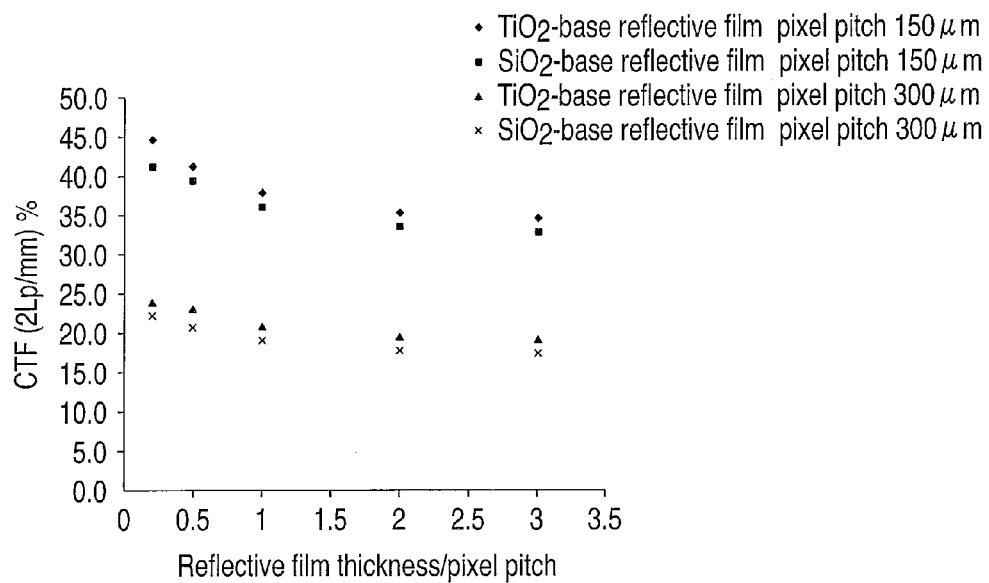
F I G. 25
| Filler material adding rate (wt.%) | 0 | 2 | 5 | 10 | 15 | 20 |
|---|---|---|---|---|---|---|
| Filler material A | 45 | 46 | 48 | 50 | 52 | 54 |
| Filler material B | 45 | 48 | 50 | 53 | 55 | 57 |
F I G. 26

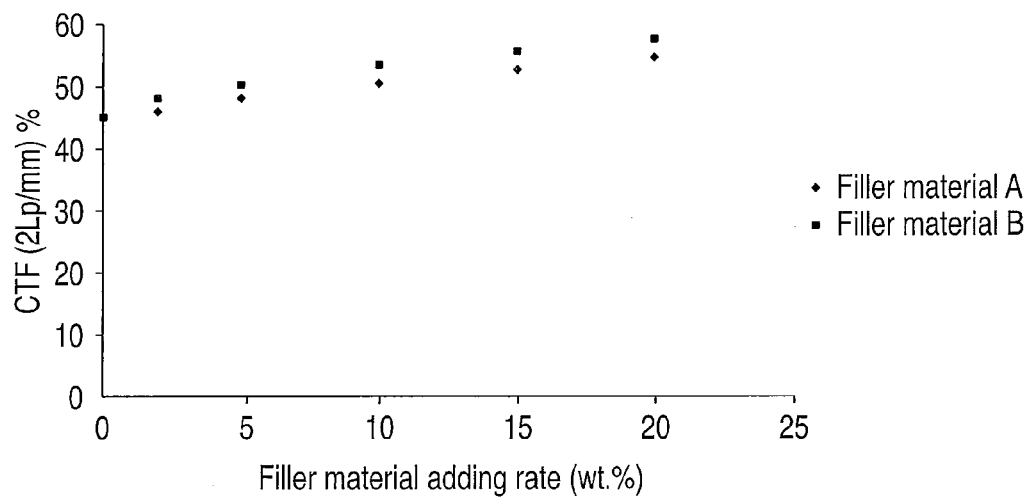
F I G. 27
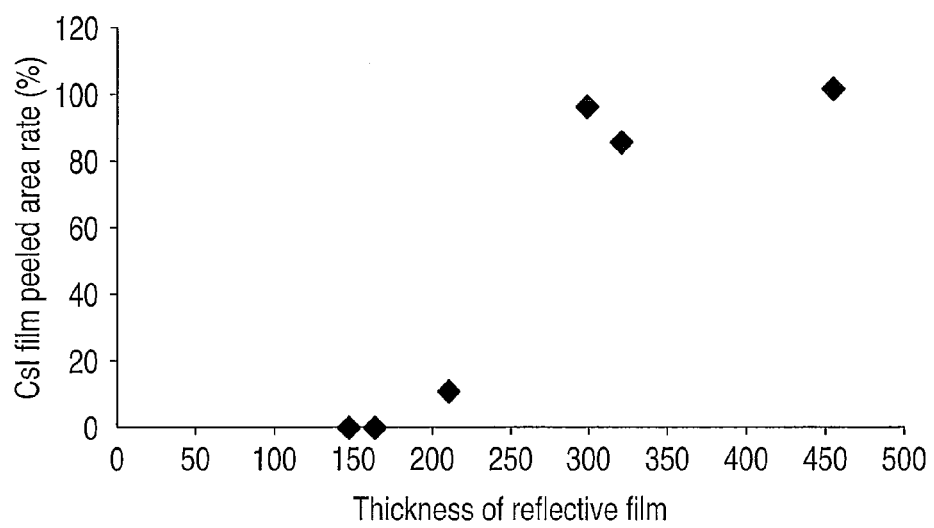
F I G. 28

|  | Without reflective film | Present example | Al reflective plate | AgPtCu reflective film |
|---|---|---|---|---|
| Luminance (with respect to HG-H2 Back ratio) | 1.4 | 2.6 | 2.3 | 0.9 |
| CTF (2Lp/mm) % | 44 | 43 | 35 | 56 |

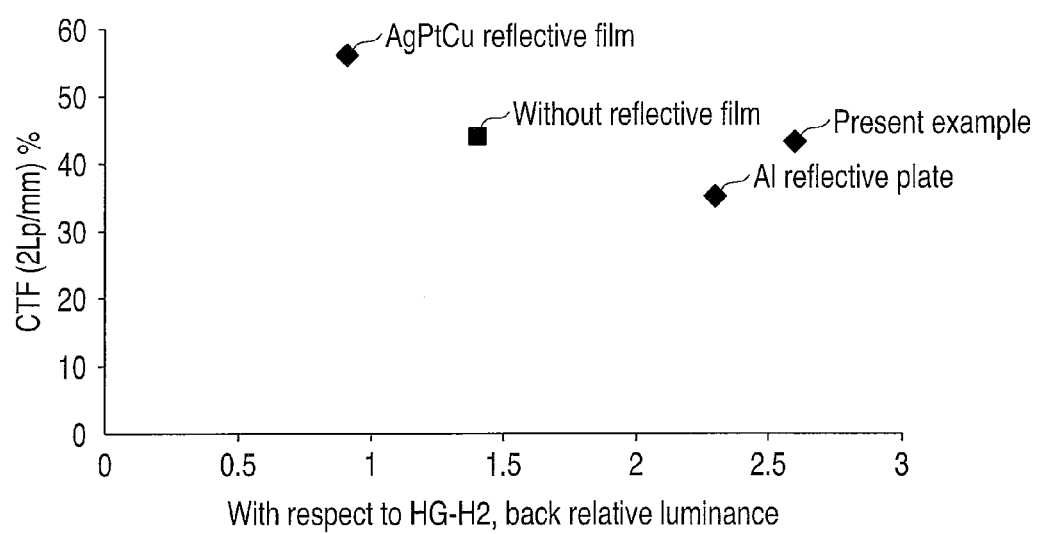
F I G. 31

RADIATION DETECTOR AND METHOD FOR MANUFACTURING THE SAME

CROSS REFERENCE TO RELATED APPLICATIONS

This is a Continuation Application of PCT Application No. PCT/JP2008/063292, filed Jul. 24, 2008, which was published under PCT Article 21(2) in Japanese.

This application is based upon and claims the benefit of priority from prior Japanese Patent Application No. 2007-194590, filed Jul. 26, 2007, the entire contents of which are incorporated herein by reference.

BACKGROUND OF THE INVENTION

1. Field of the Invention

The present invention relates to a radiation detector for detecting radioactive rays and a method for manufacturing the radiation detector.

2. Description of the Related Art

A flat X-ray detector using an active matrix has been developed as a new-generation detector for X-ray diagnosis. Detecting X-rays impinging on the X-ray detector causes an X-ray radiographic image or a real-time X-ray image to be output as digital signals. In the X-ray detector, X-rays are converted to visible light, that is, fluorescence by a scintillation layer, and the fluorescence is converted to signal charges by a photoelectric conversion element, such as an amorphous silicon (a-Si) photodiode or charge coupled device (CCD), so that an image is acquired.

As a material for forming a scintillation layer, in general, cesium iodide (CsI): sodium (Na), cesium iodide (CsI): thallium (Tl), sodium iodide (NaI), gadolinium oxysulfide ($Gd_2O_2S$) or the like is used. Upon forming a scintillation layer, a groove is formed by dicing or the like, and a material is deposited by a vapor deposition method so as to form a pillar structure, allowing improvement in resolution characteristics.

To improve sensitivity characteristics by increasing usage efficiency of fluorescence from a scintillation layer, there is a method of forming a reflective film on the scintillation layer. In other words, of fluorescence emitted in the scintillation layer, fluorescence moving toward a side remote from photoelectric conversion elements is reflected from a reflective film to increase fluorescence that arrives at a side of the photoelectric conversion elements.

As an exemplary method of forming a reflective film, a method of forming a metal layer of a silver alloy, aluminum or the like, which has high fluorescence reflectance, on a scintillation layer is generally known. As another method, for example, disclosed in Jpn. Pat. Appln. KOKAI Publication No. 2005-283483 (pp. 5 to 6, FIG. 1) is a method of applying a reflective material of light-scattering reflective properties, which contains a light-scattering substance, such as $TiO_2$, and binder resin.

A scheme of using a reflective plate having a metal surface of aluminum or the like placed on scintillation layer, instead of a reflective film is also practically implemented.

BRIEF SUMMARY OF THE INVENTION

However, with a method of forming a metal layer on a scintillation layer as used conventionally, there is one unavoidable problem of low reflectance because of the influence of the surface roughness on the scintillation layer. There are measures for improving the low reflectance, such as planarization of the surface of the scintillation layer, and forming the transparent, resin protective film on the surface of the scintillation layer to smoothen it. In these cases, however, the near surface region of the scintillation layer is impaired because such planarization causes a dead layer or an inefficient layer for scintillation. Also, although pillars of the scintillation layer is separated to provide improvement of the resolution due to a light guide effect, intrusion of the resin protective film into the spaces among pillars diminish the light guide effect, leading to decrease of the resolution. Disadvantages in these cases are serious.

With a method of placing a reflective plate on a scintillation layer, differences in spaces between a reflective plate and a scintillation layer causes un-uniformity in effective luminance and resolution. In this method, a transparent protective resin layer against moisture such as poly-para-xylylene film is applied to the scintillation layer usually. But there are problems such as penetration of the resin into spaces among pillars of the scintillation layer, which leads to decrease in resolution.

In the method of applying a reflective film containing light-scattering particles, such as $TiO_2$ particles, and binder resin, spaces among particles of the light-scattering substance are densely filled with the resin binder. Therefore, the light-scattering effect of the light-scattering substance such as $TiO_2$, which has a high refractive index, or the like is largely decreased. The reason for this is that as compared to the difference in refractive index between $TiO_2$, which has a high refractive index (refractive index 2.7), and the atmosphere (refractive index 1.0), the difference in refractive index (another refractive index difference) between $TiO_2$ (refractive index 2.7) and the resin binder (refractive index approximately 1.6) is small. Accordingly, the less the difference in the refractive indexes between $TiO_2$ particles and the surrounding substance, the smaller the refraction angles or the reflection probability at the interfaces.

Light-scattering particles change the direction of travel of light at random by repeated interface reflection and refraction between the light-scattering particles and the surrounding substance. This effect allows the film formed using the light-scattering particles to play the role of reflective film. As described previously herein, if the spaces are filled with the binder resin such that the spaces are eliminated as usual, the refractive index difference at the interface between the light-scattering particles and the surrounding substance (=binder resin) reduces. This reduction results in increasing the average number of reflection and refraction required for changing the light direction to a certain extent. In other words, it means that a detour needs to be made so that the direction of fluorescence is changed to the same extent. The detour leads to diffusion of fluorescence far away both in the film thickness direction and the film plane direction of the reflective film. Therefore, through the inside of the reflective film, fluorescent cross-talk among pillars increases, reducing the resolution. Reduction in brightness of the fluorescence due to the detour is also caused in the inside of the reflective film.

The present invention has been made in view of the above-described matters, and an object of the invention is to provide a radiation detector with a high resolution and high luminance and a method of manufacturing the same.

In order to solve the above problem, according to an aspect of the present invention there is provided a radiation detector comprising:

a photoelectric conversion element;

a scintillation layer which converts radioactive rays to fluorescence, the scintillation layer being formed on the photoelectric conversion element; and a reflective film formed on the scintillation layer, the reflective film containing light-scattering particles for reflecting the fluorescence from the scintillation layer and a binder material binding the light-scattering particles, and having depletion portions without being filled with the binder material, the depletion portions being formed in a periphery of the light-scattering particles.

According to another aspect of the present invention, there is provided a method of manufacturing a radiation detector comprising:

forming a photoelectric conversion element on a substrate;

forming a scintillation layer on the photoelectric conversion element; and applying a coating paste to the scintillation layer and thereafter drying the coating paste, the coating paste being obtained by stirring and mixing light-scattering particles, a binder material binding the light-scattering particles, and a solvent having a boiling point of 100° C. or more for dissolving the binder material, to form a reflective film having a depletion portion without being filled with the binder material, the depletion portions being formed in a periphery of the light-scattering particles.

BRIEF DESCRIPTION OF THE SEVERAL VIEWS OF THE DRAWING

FIG. 3 shows a first example of the embodiment, and particularly shows, in a table, results of examining a relationship between a content percentage of depletion portions of a reflective film of the X-ray detector and resolution characteristics.

FIG. 4 shows the first example, and particularly is a graph showing results of examining the relationship between the content percentage of depletion portions of the reflective film and the resolution characteristics.

FIG. 11 shows a third example of the embodiment, and particularly shows, in a table, results of examining a relationship between a content percentage of $TiO_2$ light-reflecting particles contained in a reflective film and resolution characteristics.

FIG. 12 shows the third example, and particularly is a graph showing results of examining the relationship between the content percentage of $TiO_2$ light-reflecting particles contained in the reflective film and the resolution characteristics.

FIG. 13 shows the third example, and particularly shows, in a table, results of examining a relationship between a content percentage of $Al_2O_3$ light-reflecting particles contained in the reflective film and resolution characteristics.

FIG. 14 shows the third example, and particularly is a graph showing results of examining the relationship between the content percentage of $Al_2O_3$ light-reflecting particles contained in the reflective film and the resolution characteristics.

FIG. 15 shows the third example, and particularly shows, in a table, results of examining a relationship between a content percentage of $SiO_2$ light-reflecting particles contained in the reflective film and resolution characteristics.

FIG. 16 shows the third example, and particularly is a graph showing results of examining the relationship between the content percentage of $SiO_2$ light-reflecting particles contained in the reflective film and the resolution characteristics.

FIG. 21 shows a seventh example of the embodiment, and particularly shows, in a table, results of examining a relationship among the size of a light-scattering particle, a pillar pitch and resolution characteristics.

FIG. 22 shows the seventh example, and particularly is a graph showing results of examining the relationship among the size of a light-scattering particle, the pillar pitch and resolution characteristics.

FIG. 25 shows the ninth example, and particularly is a graph showing results of examining effects of the pixel pitches of the array substrates and the thicknesses of the reflective films on resolutions.

FIG. 26 shows a tenth example of the embodiment, and particularly shows, in a table, results of examining a relationship between the addition rate of a filler material and resolution.

FIG. 27 shows the tenth example, and particularly is a graph showing results of examining the relationship between the addition rate of the filler material and the resolution.

FIG. 28 shows an eleventh example of the embodiment, and particularly is a graph showing results of examining a relationship between the thickness of a reflective film and the peeling of a scintillation layer in the case where the reflective film is not applied to side surfaces of the scintillation layer.

FIG. 31 shows the twelfth example, and particularly is a graph showing results of examining the characteristics of the luminance and the resolution by the reflective film method.

DETAILED DESCRIPTION OF THE INVENTION

Embodiment of the present invention will be described below with reference to the accompanying drawings.

Figure 1:
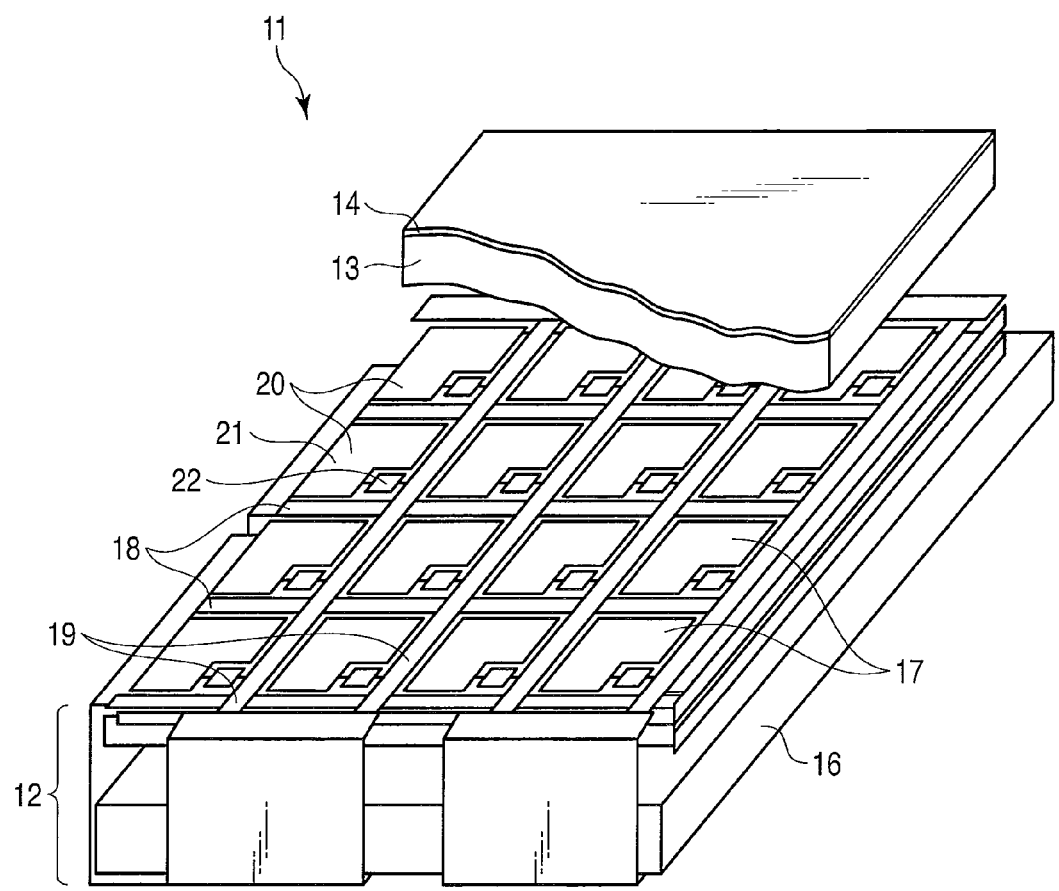
FIG. 1 is a perspective view showing an X-ray detector according to an embodiment of the present invention.
Figure 2:
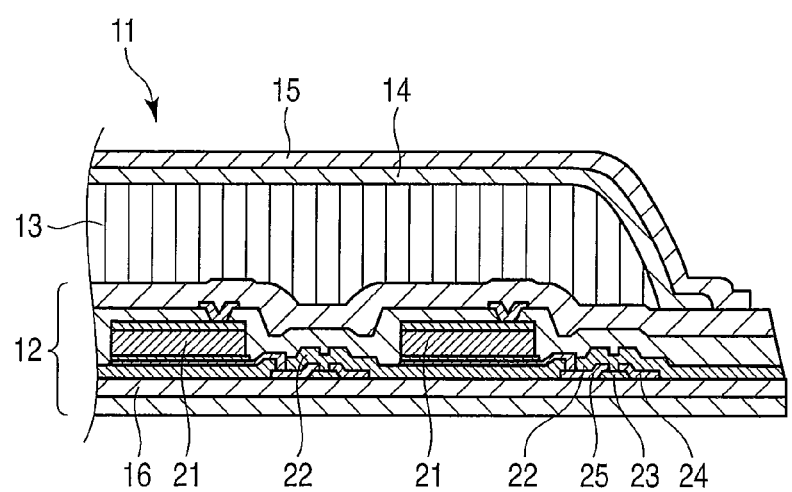
FIG. 2 is a cross-sectional view showing the X-ray detector shown in FIG. 1.

FIG. 1 is a perspective view of an X-ray detector 11 as a radiation detector, and FIG. 2 is a cross-sectional view of the X-ray detector. The X-ray detector 11 is an X-ray plane sensor for detecting an X-ray image as a radiological image, and is used, for example, for general medical applications. The X-ray detector 11 includes an array substrate 12 functioning as a photoelectric conversion substrate for converting fluorescence to an electrical signal, a scintillation layer 13 that is provided on the front surface, or one main surface, of the array substrate 12 and functions as an X-ray conversion unit for converting incident X-rays to fluorescence, and a reflective film 14 that is provided on the scintillation layer 13 and reflects fluorescence from the scintillation layer 13 toward a side of the array substrate 12. The X-ray detector 11 includes a moisture proof film 15 as necessary. The moisture proof film 15 is provided above the scintillation layer 13 and the reflective film 14 to protect them from outdoor air and moisture.

The array substrate 12 converts fluorescence, which is obtained by conversion from X-rays to visible light by the scintillation layer 13, to an electric signal. The array substrate 12 includes a glass substrate 16, a plurality of substantially rectangular photoelectric conversion units 17 that are provided on the glass substrate 16 and function as optical sensors, a plurality of control lines (or gate lines) 18 disposed along the row direction, a plurality of data lines (or signal lines) 19 disposed along the column direction, a control circuit (not shown) to which each control line 18 is electrically connected, and an amplifying/converting unit (not shown) to which each data line 19 is electrically connected.

In the array substrate 12, pixels 20 each having the same structure are formed in a matrix. In each pixel 20, a photodiode 21 as a photoelectric conversion element is disposed. The photodiode 21 is disposed below the scintillation layer 13.

Each pixel 20 includes a thin-film transistor (TFT) 22 as a switching element electrically connected to the photodiode 21, and a storage capacitor (not shown) as a charge storage unit storing signal charges resulting from conversion in the photodiode 21. However, the capacitance of the photodiode 21 may also function as the storage capacitor, and the storage capacitor is not necessarily needed.

Each TFT 22 has a switching function. Each TFT 22 switches between storing charges, which are produced by incidence of fluorescence on the photodiode 21, to a storage capacitor and discharging the charges from the storage capacitor. At least part of the TFT 22 is made of a semiconductor material, such as amorphous silicon (a-Si) as an amorphous semiconductor or polysilicon (P—Si) as a polycrystalline semiconductor. Also, the TFT 22 has a gate electrode 23, a source electrode 24 and a drain electrode 25. The drain electrode 25 is electrically connected to the photodiode 21 and the storage capacitor.

The storage capacitor is formed in a rectangular flat plate shape, and is disposed below the photodiode 21 such that the storage capacitor faces the photodiode 21.

The control line 18 extends along the row direction, and is disposed between the pixels 20. The control line 18 is electrically connected to the gate electrode 23 of the TFT 22 of each pixel 20 at the same row as that of the control line 18.

The data line (signal line) 19 extends along the column direction, and is disposed between the pixels 20. The data line (signal line) 19 is electrically connected to the source electrode 24 of the TFT 22 of each pixel 20 at the same column as that of the data line (signal line) 19.

The control circuit controls the operating state, that is, the on or off state, of each TFT 22. The control circuit is implemented in a side end portion along the row direction on the front surface of the glass substrate 16.

The amplifying/converting unit has, for example, a plurality of charge amplifiers each disposed corresponding to each data line 19, a parallel/serial converter to which these charge amplifiers are electrically connected, and an analog-digital converter to which a parallel/serial converter is electrically connected.

The scintillation layer 13 converts incident X-rays to visible light, or fluorescence. The scintillation layer 13 is formed of cesium iodide (CsI): thallium (Tl) or sodium iodide (NaI): thallium (Tl) in a pillar structure by a vacuum deposition method. The scintillation layer 13 may be formed in a quadrangular prism by mixing gadolinium oxysulfide ($Gd_2O_2S$) fluorescent material particles with a binder material, applying the mixture to the array substrate 12 and baking and curing it, and dicing it with a dicer to form a groove portion. The atmosphere or an inert gas, such as nitrogen ($N_2$) for antioxidation, is enclosed in the pillar spaces of the scintillation layer 13. The pillar spaces of the scintillation layer 13 may be in a vacuum state. In each example described below, the scintillation layer 13 is formed by using a deposition film of CsI:Tl. The thickness of the deposition film is approximately 600 μm. A pillar of a pillar structure crystal of the CsI:Tl deposition film has a thickness of approximately 8 to 12 μm around at the highest point (tip of pillar).

Finally, the X-ray detector 11 is completed by sequentially forming the scintillation layer 13 and the reflective film 14 on the array substrate 12 as described above. In each example to be described below, to simply evaluate effects of the reflective film 14 on the luminance and the resolution, a method of forming the scintillation layer 13 of CsI:Tl on a substrate made of glass, forming the reflective film 14 of various types on the above scintillation layer 13, and measuring luminance and resolution (CTF) characteristics was appropriately used. Here, a method was employed in which X-rays enter from the side of the reflective film 14 and the scintillation layer 13, and radiograph is taken from substrate side by a CCD camera with the interface between the glass substrate and the scintillation layer 13 being in focus.

Regarding the X-ray quality conditions, conditions equivalent to RQA-5 were achieved by filtering X-rays of 70 KVp with 22 mm AL. Regarding the luminance, the relative luminance for the intensifying screen (HG-H2 back made by Fujifilm Corporation) as the standard is employed. Regarding the resolution, the value of a contrast transfer function (CTF)

of 2 Lp/mm=CTF (2 Lp/mm) % of a resolution chart image was obtained by image processing.

Next, a first example of the present embodiment will be described.

The reflective film 14 reflects fluorescence emitted from the scintillation layer 13 toward a side remote from the photodiodes 21 to increase the light amount of the fluorescence that arrives at the photodiodes 21. The reflective film 14 contains light-scattering particles. In the reflective film 14, depletion portions (spaces) that are not filled with a binder material are formed in the periphery of the light-scattering particle. The binder material is a thermosetting resin material, such as silicone resin or epoxy resin, or a thermoplastic resin material, such as methacrylic resin such as acryl or polyvinyl acetal resin such as butyral resin. The light-scattering particle is $TiO_2$ powder, $Al_2O_2$ powder or $SiO_2$ powder having an average particle size of the submicron order.

Particularly in the case of a binder material of butyral resin, a crack is unlikely to occur in a film of coating, allowing a high-quality reflective film to be formed. Upon producing a coating paste, first, a binder material and a solvent are compounded, and a binder material is dissolved in the compound while the compound is being heated. Further, light-scattering particles are mixed and stirred. Thus, a coating paste is produced. In forming the reflective film 14 by using a coating paste, the coating paste is applied to the scintillation layer 13 by a method, such as brush coating, blade, dispenser or contact metal screen printing, and is left at normal room temperature or is dried in a drying oven. Thus, the reflective film 14 is formed.

A reflective film according to the present invention includes light-scattering particles having high refractive indices, a small amount of binder resin that binds them, and space regions that are not filled with the binder, which are contained in the reflective film. It is an important feature that regions having high refractive indices and made of light-scattering particles and regions having the lowest refractive index (n=1) and made of space portions mutually disperse in a film. As compared to the case of formation only from light-scattering particles and a binder material, changes in refractive index in the reflective film are large because of formation including space regions having the lowest refractive index (n=1). Refraction between substances (or between a substance and a space) having different refractive indices, which is the cause of light scattering, is efficiently generated. This generates diffuse reflection, which is better reflection of a film. Accordingly, reflection is allowed with fluorescence from the scintillation layer restricted within a close range (within a small area), without the fluorescence spreading far away. As a result, decrease in resolution and decrease in luminance can be prevented. That is, a radiation detector excellent in luminance and resolution is obtained.

Here, the smaller the size of the light-scattering particle, the larger the number of light-scattering particles per unit volume for filling. Therefore, it becomes easy to obtain the reflection effect with a small area. However, if the size of a light-scattering particle is decreased to approximately one tenth or less the wavelength of fluorescence, the effect of refracting fluorescence is reduced. To ensure the reflection effect with a smaller area, it is preferable that the size of a light-scattering particle be substantially in the range of ten times to one tenth the maximum wavelength of fluorescence.

From the viewpoint of selecting a material whose refractive index n is high, Rutile type $TiO_2$ (n approximately 2.72) was used as a material for the light-scattering particles. As another light-scattering particle material, inorganic materials such as Anatase type $TiO_2$, $Al_2O_3$ or $SiO_2$ can be used. Rutile type $TiO_2$ is particularly excellent in that it has a large ratio to the refractive index of resin of a binder material.

The periphery of the light-scattering particle is more preferable as the refractive index is smaller. Ideally speaking, vacuum, the atmosphere and other gas states (n approximately 1.0) are the most preferable. However, a binder material is used so as to keep the shape as the reflective film 14. To ensure a good reflection effect with a small area, it is preferable that the refractive index of a binder material and the volume occupation rate of the binder material be as small as possible. Also, to reduce the loss of absorption of fluorescence by the light-scattering particles and the binder material, it is preferable that the fluorescence transmittance of the binder material be as high as possible. In the present example, acrylic resin, butyral resin, epoxy resin or silicone resin is used as the binder material, and the mixing ratio between $TiO_2$ and the binder material and the rate of adding a solvent were each varied.

The light-scattering particle exemplified previously is an inorganic powder particle having a high refractive index. Surface-reflection metallic powder of metal of Au, Ag, Pt or Al or its alloys, or a particle provided with the surface reflection property obtained by covering the metal or the alloy sufficiently functions as a light-scattering particle. It is preferable that the size of a light-scattering particle be substantially in the range of one tenth to ten times the wavelength of fluorescence, which is the same as in the case of an inorganic powder particle.

As described above, the volume percentage of the depletion portions (spaces) in the formed reflective film 14 largely affects the reflective film characteristics. The degree of depletion portions (spaces) largely depends on the mixing ratios of the light-scattering particles and the binder material that are mixed upon producing a coating paste, as described later. That is, as the volume mixing ratio of the light-scattering particles increases and the volume mixing ratio of the binder material decreases, the volume percentage of the depletion portions (spaces) increases. The kind and the adding amount of the solvent slightly affects the degree of the depletion portions (spaces). However, for the degree of the depletion portions (spaces) under dry conditions, the volume mixing ratios of the light-scattering particles and the binder material upon producing a coating paste are dominant.

A tentative calculation for the degree (percentage) of the depletion portions (spaces) of the reflective film 14 was made from the volume of the reflective film and the mass of the constituent (light-scattering particles and binder material). The relationship between the degree of the depletion portions and the characteristics of the reflective film (resolution=CTF (2 Lp/mm) %) was investigated. Each reflective film 14 was formed to have a thickness of approximately 100 to 200 μm on the scintillation layer 13 of a 600 μm CsI:Tl deposition film.

The results are shown in FIGS. 3 and 4. Semi-quantitatively, it was seen that the resolution (index was CTF (2 Lp/mm) %) improved as the percentage of containing depletion portions (spaces) of the reflective film 14 increased.

Figure 5:
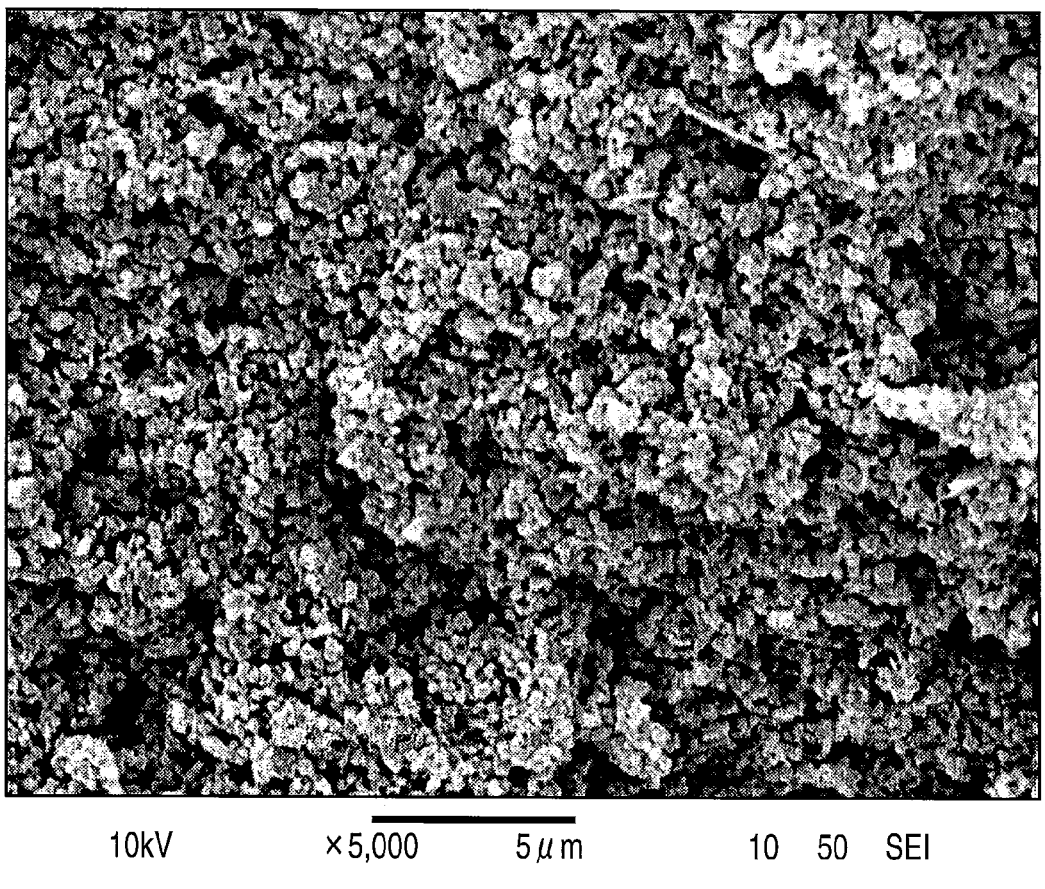
FIG. 5 shows the first example, and particularly shows the reflective film having a high resolution in a microphotograph (SEM photograph).
Figure 6:
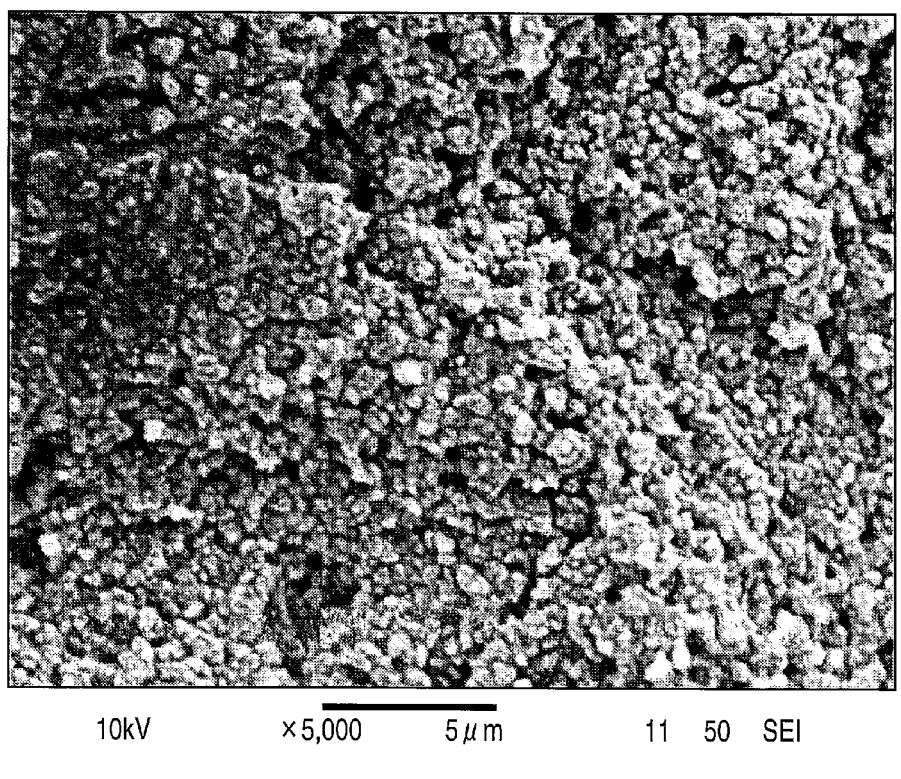
FIG. 6 shows the first example, and particularly shows the reflective film having a low resolution in a microphotograph (SEM photograph).

When the cross-section of the reflective film 14 is observed, the reflective film 14 having a high resolution has a large depletion portion (space) percentage as shown in a microphotograph (SEM photograph) of FIG. 5. The depletion portions (spaces) were observed evenly in any portion of the reflective film 14. It is important in consideration of the mechanism of diffuse reflection previously described that the depletions portion disperse as evenly as possible. On the other hand, as shown in a microphotograph (SEM photograph) of FIG. 6, in the reflective film 14 having a low resolution, $TiO_2$ particles were almost completely covered in the binder material such that depletion portions (spaces) were barely or hardly seen.

Accordingly, depletion portions not filled with the binder material in the periphery of the light-scattering particles are formed in the reflective film 14, allowing the X-ray detector 11 with a high resolution and high luminance to be provided.

Next, a second example of the present embodiment will be described.

Rutile type $TiO_2$ powder as the light-scattering particles in the reflective film 14 and butyral resin as the binder material are compounded. Here, the mass ratio of the Rutile type $TiO_2$ powder to the butyral resin is 90:10. Thereafter, a coating paste was produced using cyclohexanone as the solvent. The viscosity of the coating paste was varied by varying the addition rate of cyclohexanone. The coating paste was applied to the scintillation layer 13 of a CsI:Tl deposition film to form the reflective film 14. The method of applying the coating paste was brush coating. Regarding drying, room temperature drying (air drying) was performed for half a day. In forming the reflective film 14, adjustment was made so that the film thickness after drying was approximately 200 μm.

Figure 7:
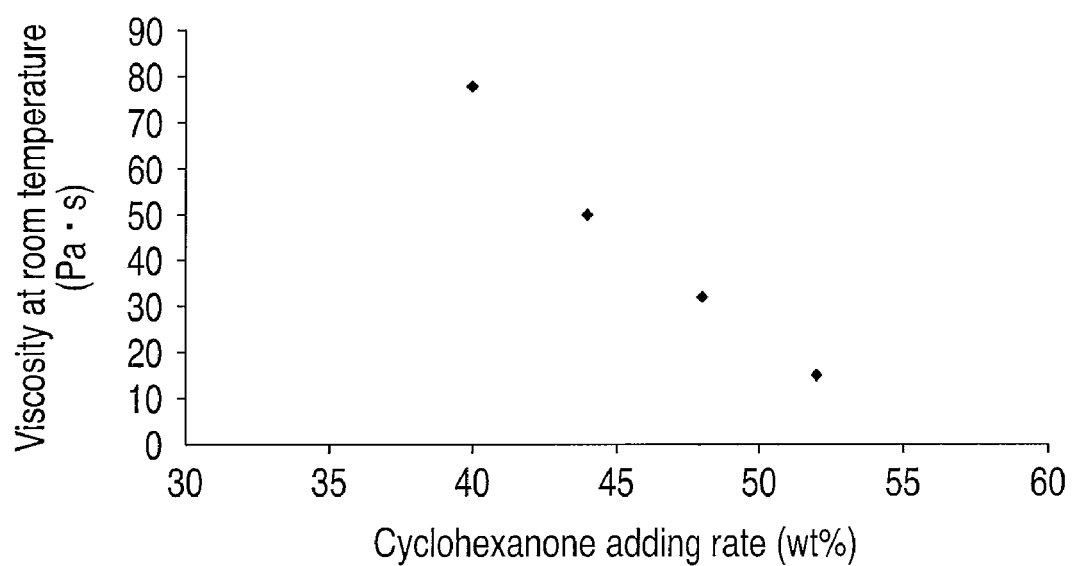
FIG. 7 shows a second example of the embodiment, and particularly is a graph showing results of examining a relationship between an adding rate of cyclohexanone and a viscosity of a coating paste.

As shown in FIG. 7, the viscosity of the coating paste was varied in accordance with the rate of adding cyclohexanone. The penetration state of the reflective film 14 into spaces among pillars of the scintillation layer 13 of a pillar structure changed.

Figure 8:
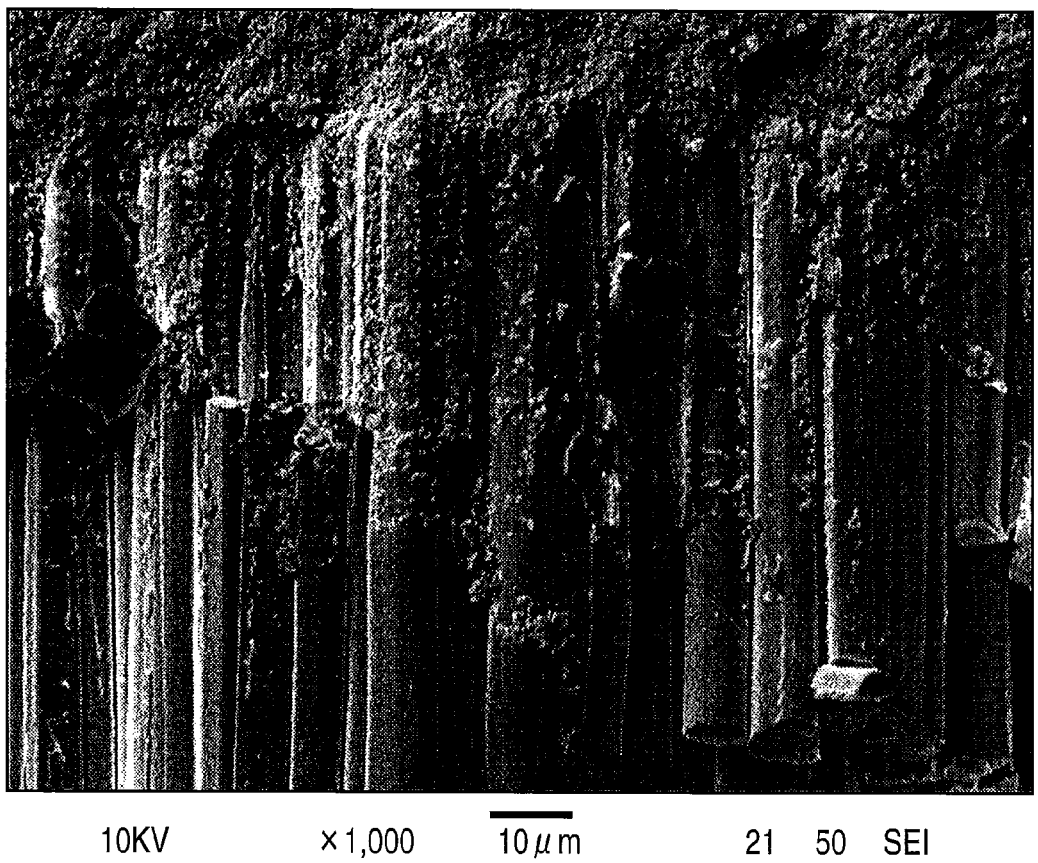
FIG. 8 shows the second example, and particularly shows, in a microphotograph (SEM photograph), a scintillation layer and a reflective film in the case where penetration of the reflective film into spaces among pillars of the scintillation layer in the X-ray detector is large.
Figure 9:
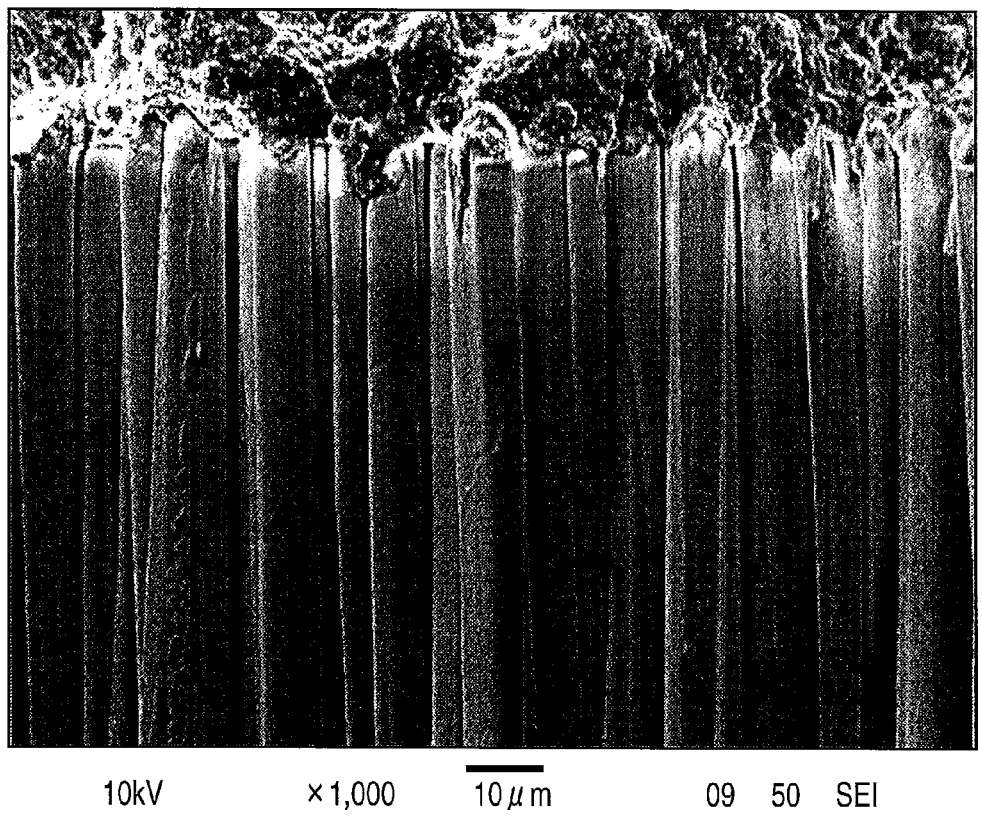
FIG. 9 shows the second example, and particularly shows, in a microphotograph (SEM photograph), the scintillation layer and the reflective film in the case where penetration of the reflective film into spaces among pillars of the scintillation layer is small.
Figure 10:
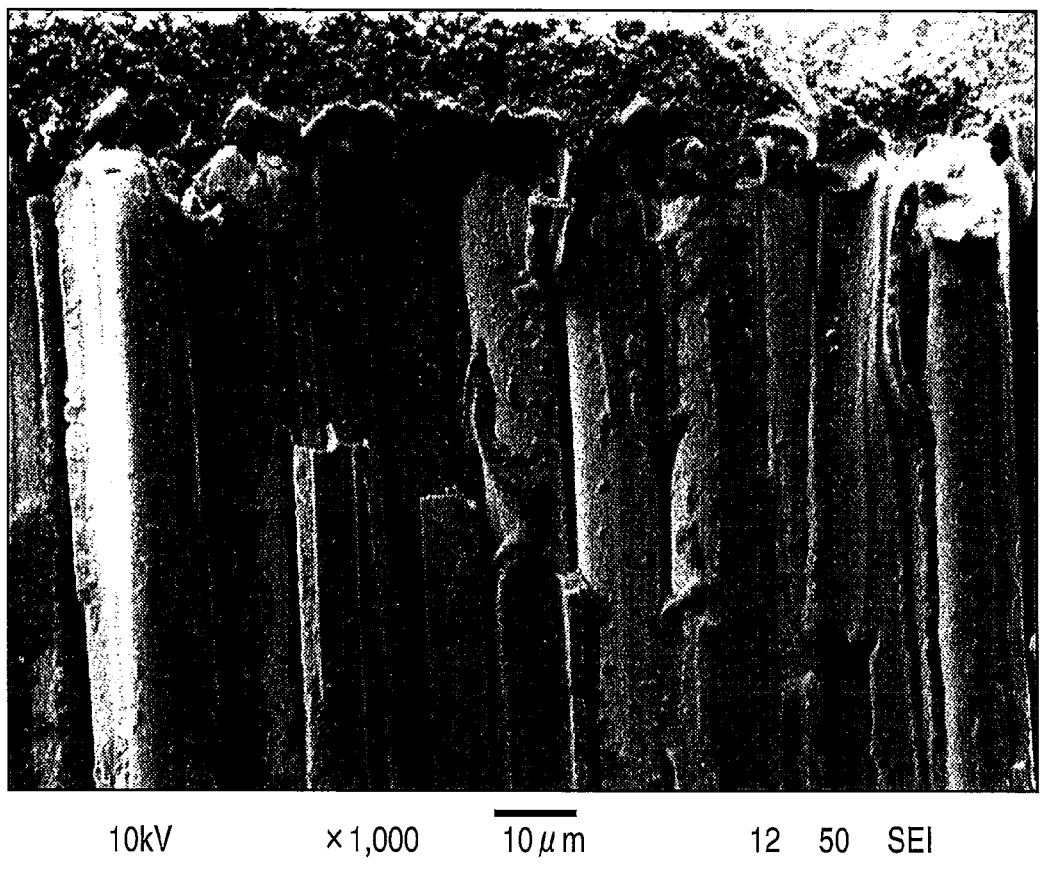
FIG. 10 shows the second example, and particularly shows, in a microphotograph (SEM photograph), the scintillation layer and the reflective film in the case where penetration of the reflective film into spaces among pillars of the scintillation layer is large, but the ratio of a binder material to light-scattering particles is high.

Microphotographs (SEM photographs) of FIGS. 8 to 10 show the penetration state of the reflective film 14 into spaces among pillars of the scintillation layer 13.

FIG. 8 shows the case where the penetration of the reflective film 14 into spaces among pillars of the scintillation layer 13 is large. In this case, there was penetration of many light-scattering particles in the reflective film 14 into spaces among pillars of the scintillation layer 13, CTF (2 Lp/mm)=48%, and high-resolution characteristics were obtained.

FIG. 9 shows the case where the penetration of the reflective film 14 into spaces among pillars of the scintillation layer 13 is small. In this case, there was penetration of few light-scattering particles in the reflective film 14 into spaces among pillars of the scintillation layer 13, and CTF (2 Lp/mm)=37%.

FIG. 10 shows the case where the penetration of the reflective film 14 into spaces among pillars of the scintillation layer 13 is large, but the ratio of the binder material to the light-scattering particles is high. In this case, there was penetration of much binder material of the reflective film 14 into spaces among pillars of the scintillation layer 13, but there was penetration of few light-scattering particles, and CTF (2 Lp/mm)=28%. This is presumed to be because the binder material fills spaces among pillars of the scintillation layer 13 to reduce a light guide effect due to the pillar structure of a CsI deposition film. Accordingly, when the reflective film 14 penetrates spaces among pillars of the scintillation layer 13, it is important to keep the mixing ratio of the light-scattering particles/binder material of the reflective film 14 to be high.

Next, a third example of the present embodiment will be described.

Changes in characteristics of the reflective film 14 were investigated by setting the kind and size of the light-scattering particle, the kind of the binder material, and the filling rate (blending ratio) of the light-scattering particles in various values. In trial manufacture of the light-scattering particles, $TiO_2$, $Al_2O_3$ and $SiO_2$ were used, and the particle size was set in the range of the submicron level to several tens of micrometers. The kinds of the binder material in the trial manufacture of the light-scattering particles were silicone resin, epoxy resin, acrylic resin and butyral resin. In the trial manufacture of the light-scattering particles, volume ratios were assigned as the mixture ratio of the light-scattering particles and the binder material. At this point, characteristics of the luminance and the resolution were evaluated with the light-scattering particle and the binder material, and their volume ratio assigned on the whole as follows.

The ratio of light-scattering particles to binder material=10:90 to 80:20.

The thickness of each reflective film 14 was approximately 100 to 300 μm. The thickness of each reflective film 14 is a thickness that nearly shields the film from transmission of fluorescence (peak wavelength approximately 540 nm) of the scintillation layer 13 of CsI:Tl. As mentioned above, representative results of trial manufacture of various kinds of the reflective films 14 are shown in FIGS. 11 to 16.

FIGS. 11 and 12 show luminance and resolution characteristics in the case where the reflective film 14 was made as trial manufacture while varying the mixing ratio of the light-scattering particles and the binder material of various kinds of resin. The light-scattering particles were powder of Rutile-type $TiO_2$ (refractive index n≈2.72) having an average particle size of 0.3 μm. Like the first example described above, as the ratio between the light-scattering particles and the binder material constituting the reflective film 14 (amount of light-scattering particles/amount of binder material) is higher, the reflective film 14 having a higher resolution is obtained. However, optical phenomena related to refraction and reflection are not directly relevant to mass, and depends on dimensions such as a particle size and a volume ratio. Therefore, volume content percentages of the light-scattering particles and the binder material were used as parameters. As the light-scattering particles, transparent inorganic powder particles, such as Rutile-type $TiO_2$, $Al_2O_3$ and $SiO_2$, are used. The average size of these particles is of the submicron order. As the binder material, butyral resin and acrylic resin, which are thermoplastic resin, and epoxy resin and silicone resin, which are thermosetting resin, are used.

The value of CTF (2 Lp/mm), or the index of resolution, is in the range of approximately 30 to 35% until the volume ratio of the light-scattering particles to binder material is close to 4:6. However, as the blending ratio of the light-scattering particles increases from being close to 4:6, the CTF value increases. As the blending ratio of the light-scattering particles increases from being close to 5:5, the CTF value becomes 40% or more.

FIGS. 13 and 14 show examination results of the case where light-scattering particles of $Al_2O_3$ were applied. FIGS. 15 and 16 show examination results of the case where light-scattering particles of $SiO_2$ were applied. In both cases, the degree of improvement of the CTF value is slightly lower than that in the case of using $TiO_2$. However, the same tendency was confirmed for the dependence on the blending ratio of the light-scattering particles and the binder material.

As a result of observing the cross-section of the reflective film 14 by using SEM photographs for these blending ratios, the same relationship between the depletion portions (spaces) and the resolution of the reflective film 14 as described in the first example was confirmed. That is, in the reflective film 14 having a volume ratio of light-reflecting particles to binder material of less than approximately 4:6, the binder material fills spaces between the light-reflecting particles with little clearance. Examples of the above ratio of less than 4:6 as used herein include 3:7.

On the other hand, as the volume ratio of the light-reflecting particles to binder material in the reflective film 14 increases to approximately 4:6 or more, the depletion portions (spaces) that are not filled with the light-reflecting particles and the binder material are actualized. As described above, the refractive index ratio of the light-scattering particles to the depletion portions (spaces) formed in the periphery thereof is large. This allows the maximum reflection effect to be achieved with a small area. Increasing the reflection effect with a small area is considered to lead to inhibiting reflected light of fluorescence emitted from the scintillation layer 13 from spreading far away to express high-resolution characteristics. Also, because of increasing the reflection effect with a small area, the passing distance in the reflective film 14 for which fluorescence of the scintillation layer 13 is returned from the reflective film 14 to the scintillation layer 13 is reduced to be short. The fluorescence is not excessively absorbed, and therefore increasing the reflection effect with a small area is effective from the viewpoint of keeping high luminance.

Next, a fourth example of the present embodiment will be described.

Coating pastes were manufactured by way of trial by using the light-reflecting particles in the reflective film 14 and the binder material. At this point, Rutile-type $TiO_2$ having an average particle size of 0.3 μm was used as the light-reflecting particles in the reflective film 14. As the binder material, silicone resin and epoxy resin, which are thermosetting resins, and acrylic resin and butyral resin, which are thermoplastic resins, are used.

Then, the coating pastes were applied to the scintillation layer 13 of a CsI:Tl deposition film to form the reflective films 14, and characteristics of each reflective film 14 were compared. The solvent for dissolving resin and the adding amount thereof were suitably selected based on affinity with each binder material. As the solvent, toluene, methylcyclohexane, cyclohexanone and the like were used. Also, after the coating paste was applied to be deposited, the deposited coating paste was naturally dried to form the reflective film 14. The coating paste is produced by sufficiently mixing and kneading $TiO_2$ powder, the binder material and the solvent; however, before applying, the coating paste should be further sufficiently stirred and mixed by a rotary and revolutionary agitator.

It was found as a result of comparing reflective films 14 manufactured by way of trial that the reflective film 14 using butyral resin was apparently excellent in whole appearance quality. That is, in the reflective film 14 using butyral resin, a crack and surface irregularity affecting the whole appearance quality are unlikely to occur. If the reflective film was thick, it was found that a crack was particularly unlikely to occur in the case of using high polymer butyral resin having an average molecular weight of approximately $5 \times 10^4$ or more, among butyral resin binders.

As butyral resin used for the reflective film 14, a polymer obtained by adding butyraldehyde to polyvinyl alcohol with an acid catalyst can be used. Further, as the butyral resin, copolymer-type butyral resin with vinyl acetate or vinyl alcohol can be used.

Specific examples of butyral resin include S-LEC BL-1, BL-1H, BL-2, BL-5, BL-10, BL-S, BL-SH, BX-10, BX-L, BM-1, BM-2, BM-5, BM-S, BM-SH, BH-3, BH-6, BH-S, BX-1, BX-3, BX-5, KS-10, KS-1, KS-3 and KS-5 (made by Sekisui Chemical Co., Ltd.). Butyral resin can be appropriately selected in terms of solubility into a solvent, evenness of a film of coating, and cracking of a film of coating.

Next, a fifth example of the present embodiment will be described.

The reflective film 14 including Rutile-type $TiO_2$ powder having an average particle size of 0.3 μm and a binder material of acrylic resin or butyral resin is formed. Coating pastes are produced with varied mixing ratios of the $TiO_2$ powder and the binder material. The scintillation layer 13 is a CsI:Tl deposition film having a thickness of 600 μm. On the scintillation layer 13, a film of coating having a high $TiO_2$ content ratio (mass ratio of $TiO_2$ to binder material=90:10) is first formed, and then a film of coating having a small $TiO_2$ content ratio (mass ratio of $TiO_2$ to binder material=50:50) is formed. The film of coating having a high $TiO_2$ content ratio and the film of coating having a small $TiO_2$ content ratio each have a thickness of approximately 50 μm.

For comparison, reflective films 14 of a comparative example 1 and a comparative example 2 were manufactured by way of trial. The reflective film 14 of the comparative example 1 was formed only of a film of coating having a high $TiO_2$ content ratio (mass ratio of $TiO_2$ to binder material=90:10). The thickness of this film of coating was approximately 100 μm. The reflective film 14 of the comparative example 2 was formed only of a film of coating having a small $TiO_2$ content ratio (mass ratio of $TiO_2$ to binder material=50:50). The thickness of this film of coating was approximately 100 μm.

Figures 17, 18:
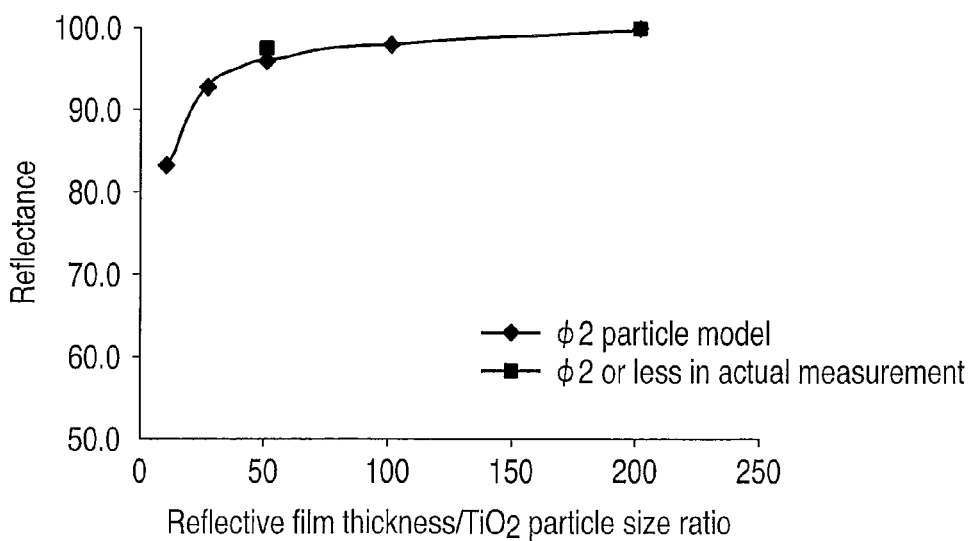
FIG. 17 shows a fifth example of the embodiment, and particularly shows, in a table, results of examining characteristics of reflective films that are different in content percentage of light-scattering particles in a direction of the thickness of the reflective film.
FIG. 18 shows a sixth example of the embodiment, and particularly is a graph showing results of an optical simulation of a relationship between the ratio of the thickness of a reflective film/light-scattering particle size and reflectance.

As a result, as shown in FIG. 17, there is little difference in resolution characteristics between the present example and the comparative example 1. However, as compared to the resolution characteristics of the present example and the comparative example 1, the resolution characteristics of the comparative example 2 are clearly inferior. Although not shown, there is little significant difference in luminance characteristics among three examples. On the other hand, a vibration test and a heat shock test were conducted for the purpose of investigating mechanical and thermal reliability (susceptibility to cracking and brittleness) of the reflective film 14. As a result of investigation, the mechanical and thermal reliability of the reflective film 14 is clearly low in the comparative example 1. Regarding the mechanical and thermal reliability of the reflective film 14, good results were obtained in the present example and the comparative example 2.

From the above, the reflective film 14 in the present example is considered to have excellent features having both the high-resolution characteristics and the mechanical and thermal reliability. It is thus considered that sufficient depletion portions (spaces) are secured in the reflective film 14 on a side near the scintillation layer 13 for which optical characteristics are more important. The depletion portions are considered to be sufficiently formed between $TiO_2$ particles because the content ratio of $TiO_2$ is high. On the other hand, a portion on a side of the surface layer of the reflective film 14 is formed of a film of the binder material having a high content ratio, and therefore the binding force between $TiO_2$ particles is enhanced because of a sufficient amount of the binder material. Therefore, the mechanical and thermal stability is considered to be ensured.

From the result of trial manufacture evaluation, measures for the $TiO_2$ content ratio of the reflective film 14 on the side of the scintillation layer 13 (reflection preference layer) should be as follows. The volume ratio of the light-scattering particle to the binder material should be 4:6 or more (volume of light-scattering particles/volume of binder material≧4/6). Note that the above can be applied to cases other than the case of substantially only $TiO_2$ powder as in the present example. Also, measures for the $TiO_2$ content ratio of the reflective film 14 on the side of the surface layer having a low $TiO_2$ content percentage (shape maintenance preference layer) should be as follows. The volume ratio of the light-scattering particle to the binder material should be 4:6 or less (volume of light-scattering particles/volume of binder material≦4/6).

In the present example, two kinds of reflective films 14 that are different from each other in volume content ratio of the light-scattering particles and the binder material were stacked. However, this is not restrictive. Stacking three or more kinds of reflective films 14 that are different from one another in the content ratio allows the above-described effect to be obtained.

As another method of varying the content ratio of $TiO_2$ in the thickness direction of the reflective film 14, for example, there is a method of utilizing a precipitation effect due to high specific gravity of $TiO_2$ in the film (coating paste). For example, this is performed by slightly increasing the adding amount of a solvent and taking a long drying time after applying a coating paste. It was confirmed that the higher the adding ratio of a solvent, the higher the gradient of the content ratio of $TiO_2$ in the thickness direction of the reflective film 14. By using the above method, a reflective film with a high resolution and high reliability can be formed, as in the method of stacking films described above.

Next, a sixth example of the present embodiment will be described.

In FIG. 18, the result of an optical path following type optical simulation is shown. If light-scattering particles are stacked substantially in ten or more layers, depending on the refractive index of the light-scattering particles, a reflectance of 80% or more is obtained in the case of using light-scattering particles having a high refractive index, such as $TiO_2$. Although not shown, a reflectance of 60% or more is obtained in the case where the refractive index of light-scattering particles is not so high, such as $SiO_2$.

On the other hand, as the size of the light-scattering particle increases, the thickness of the reflective film for obtaining a sufficient reflectance increases substantially in proportion to the increase of the particle size. In that case, the spread of reflected light returning to the side of the scintillation layer 13 increases in proportion to the thickness of the reflective film 14, causing decrease in resolution. Also, in the case of a large thickness of the reflective film 14, the optical path length is made longer to actualize decay of light, adversely affecting the luminance. Accordingly, it is desirable that the size of the light-reflecting particle be selected so that the reflective film is as thin as possible and the above relationship expression is satisfied.

In the actual reflective film 14, light-scattering particles are not regularly aligned as in an optical simulation. Therefore, how many layers of light-scattering particles on average are stacked in the reflective film 14 needs to be estimated from a relationship between the film thickness and the volume filling factor of the light-scattering particles.

Figures 19, 20:
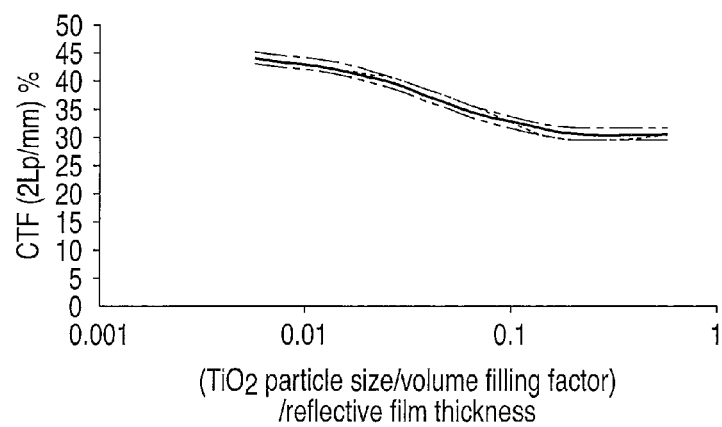
FIG. 19 shows the sixth example, and particularly shows, in a table, results of examining a relationship between (size of light-scattering particle/volume filling factor)/thickness of reflective film and resolution characteristics.
FIG. 20 shows the sixth example, and particularly is a graph showing results of examining a relationship between (size of light-scattering particle/volume filling factor)/thickness of reflective film and resolution characteristics.

FIGS. 19 and 20 show examination results of (size of light-scattering particle/volume content percentage)/reflective film thickness and resolution characteristics in the cases where the sizes of the light-scattering particle were assigned and acryl-based, butyral-based, silicone-based and epoxy-based binder materials (1) to (4) were used. The scintillation layer 13 is formed on a glass substrate of 0.7 mm by a vacuum deposition method. The scintillation layer 13 is formed of a CsI:Tl deposition film, and has a thickness of 600 µm. A coating paste is applied to the scintillation layer 13 such that the film thickness equivalent to a film thickness when the film is dried is 50 µm, and is dried, thereby forming the reflective film 14. The coating paste uses Rutile-type $TiO_2$ powder. The volume content percentage of the $TiO_2$ powder in the coating paste is 70%.

From these results, it was found that, in the case of the same film thickness, the improvement effect of the resolution particularly remarkably appeared in the range where the light-scattering particles, the volume filling factor and the reflective film thickness almost satisfy the following relationship.

The average size of the light-scattering particles/volume filling factor of the light-scattering particles $\leq 1/10 \times$ film thickness Next, a seventh example of the present embodiment will be described.

The scintillation layer 13 of a pillar structure is formed of a CsI:Tl deposition film, and has a thickness of 600 µm. In forming the scintillation layer 13, deposition conditions such as temperature and atmosphere are changed. Thus, the scintillation layer 13 in which the average pitch at the tips of pillars (columns) of the CsI:Tl deposition film is in the range of approximately 6 µm to approximately 16 µm is produced. With the average particle sizes of the Rutile-type $TiO_2$ powder assigned, the reflective films 14 were manufactured by way of trial, and a relationship between the average particle size and resolution characteristics of $TiO_2$ was examined. The binder material is silicone, epoxy, acrylic or butyral resin. The solvent is suitably selected for each binder material. The adding amount of a solvent is determined in consideration of the viscosity.

As shown in FIGS. 21 and 22, because of differences in pillar (column) pitch (in the drawings, expressed as "pillar pitch") of the scintillation layers 13 of the CsI:Tl deposition films, as a matter of course, there are differences in resolution characteristics among the scintillation layers 13. However, regarding a relationship between the $TiO_2$ particle size and the pillar pitch of the reflective film 14, remarkable improvement in resolution characteristics was found if the $TiO_2$ particle size of the reflective film 14 was lower than approximately one fourth (0.25) of the pillar pitch.

Although not shown, it was confirmed that this tendency was the same as in the scintillation layer 13 obtained by dicing a baked scintillator of GOS:Tb to separate it to pixels in a matrix. In this case, when the size of a light-scattering particle was less than or equal to approximately one fourth the pixel pitch of separation, increase in resolution characteristics was remarkable.

Next, an eighth example of the present embodiment will be described.

Figures 23, 24:
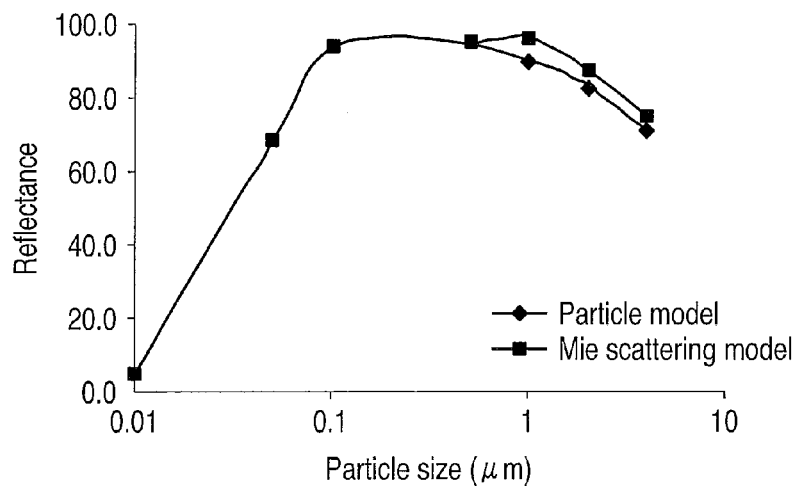
FIG. 23 shows an eighth example of the embodiment, and particularly is a graph showing results of an optical simulation of a relationship between the size of a light-scattering particle and reflectance.
FIG. 24 shows a ninth example of the embodiment, and particularly shows, in a table, results of examining effects of pixel pitches of array substrates and the thicknesses of reflective films on resolutions.

In FIG. 23, results of an optical simulation for the size and the reflectance of a light-scattering particle are shown. As a result, it is found that the size of a light-scattering particle in the reflective film 14 should be within the range of approximately one tenth to ten times the maximum wavelength of fluorescence generated in the scintillation layer 13 so that the reflective film 14 using light-scattering particles functions as the reflective film 14 that is excellent and has high reflectance. The size of a light-scattering particle of $TiO_2$ or the like actually used for trial manufacture is within the range of one tenth to ten times of a peak wavelength of fluorescence (540 nm) of CsI:Tl of the scintillation layer 13 or the main wavelength of fluorescence (535 nm) of GOS:Tb. Note that, if the average size of light-scattering particles in the reflective film 14 is within the range of one tenth to ten times the maximum light-emitting wavelength of a scintillation layer, the above-described effects can be obtained.

Next, a ninth example of the present embodiment will be described.

In FIGS. 24 and 25, results of evaluating resolution characteristics are shown. Here, the scintillation layer 13 of a CsI:Tl deposition film and the reflective film 14 are formed on each of the array substrates 12 whose pixel pitches are 150 and 300 µm. In the present example, the scintillation layer 13 and the reflective film 14 were deposited on the array substrate 12, and CTF (2 Lp/mm) % was obtained from an image output of a contrast chart of 2 Lp/mm. The resolution measured through the array substrate 12 is decreased to SIN (X)/X times by a relationship between a Niquist frequency fNq determined by the pixel pitch and a spatial frequency f (Lp/mm) for measuring the resolution. Here, $X=(\pi/2) \cdot (f/fNq)$. In the case of the present example, with the array substrate 12 having a pitch of 150 μm, the resolution of 2 Lp/mm is decreased to approximately 0.86 times the resolution of the film. With the array substrate 12 having a pitch of 300 μm, the resolution of 2 Lp/mm is decreased to about 0.50 times the resolution of the film.

The light-scattering particles used for the reflective film 14 are Rutile-type $TiO_2$ powder and $SiO_2$ powder. The Rutile-type $TiO_2$ powder is a representative of high refractive indices. The $SiO_2$ powder is a representative of low refractive indices. As found from the drawings, it is found that, under conditions where a relationship between a film thickness and the average size of light-scattering particles satisfies the relationship expression represented in the sixth example, the cases where the film thickness is less than or equal to the pixel pitch are particularly excellent in resolution characteristics. In the present example, the relationship expression represented in the sixth example is satisfied. As shown in the drawings, if the film thickness is less than or equal to the pixel pitch, it is found that the resolution characteristics are particularly excellent. However, although not shown, contrary to the resolution, luminance has a tendency of decreasing as the thickness of a reflective film is decreased. As described above, if a reflective film is thin, the rate of increasing the luminance caused by the reflective film 14 decreases. On the other hand, degradation of the resolution is suppressed. The luminance increase rate is considered to decrease in accordance with an increase of the rate at which part of fluorescence of the scintillation layer 13 passes through the reflective film 14 to be lost. The degradation of the resolution is considered to be suppressed because it inhibits fluorescence from spreading farther away in the plane direction in the reflective film 14.

Next, a tenth example of the present embodiment will be described.

In the case of manufacturing a plurality of kinds of reflective films 14 on the scintillation layer 13 by way of trial, characteristics are shown in FIGS. 26 and 27. The scintillation layer 13 is formed of a CsI:Tl deposition film, and has a thickness of 600 μm. The reflective film 14 is formed using Rutile-type $TiO_2$ powder. The content percentage of the $TiO_2$ powder in the reflective film 14 is 70%. The reflective film 14 has a thickness of 50 μm. The reflective film 14 is formed using an appropriate binder material, for example, of silicone, epoxy, acryl or butyral base, and an appropriate solvent suitable for this binder material. Also, the reflective film 14 is formed using a pigment filler material that absorbs fluorescence of the scintillation layer 13. In the trial manufacture of the reflective films 14, the adding rates of the filler material were assigned. As the adding rate of the filler material increases, the luminance slightly decreases but, in contrast, the resolution improves. This is considered to be because part of fluorescence of the scintillation layer 13 is absorbed by the filler material in the reflective film to reduce the total reflectance of the reflective film 14, so that the percentage of direct light having a small influence on resolution reduction is relatively increased. This is also considered to be because the fluorescence is inhibited from diffusing far away in the reflective film 14 to decrease a reflected light component that further decreases the resolution.

Depending on applications of the X-ray detector 11, great importance is placed on the resolution even though it decreases the luminance to some extent. Optimizing the quality, the shape and the adding amount of a fluorescence-absorptive filler material enables shifting of the balance between the luminance and the resolution. The filler material can be selected, for example, from carbon black and pigments for use in colors and paints.

Next, an eleventh example of the present embodiment will be described.

Formation of the reflective film 14 is basically performed by drying a coating paste after applying it to cover the top surface of the scintillation layer 13. However, because of volume contraction of the reflective film 14 when being dried, the reflective film 14 causes stress on the scintillation layer 13, which might result in peeling of the scintillation layer 13, that is, peeling between the array substrate 12 and the scintillation layer 13.

In the present example, a coating paste was applied to the scintillation layer 13 of a CsI:Tl deposition film, and was dried to form the reflective film 14. The coating paste includes Rutile-type $TiO_2$ powder, a silicone, epoxy, acryl or butyral binder material, and a solvent suitable for the binder material. In producing the coating paste, the adding amount of the solvent and the like were varied, although not exemplified. The scintillation layer 13 is 25 mm □ and has a thickness of 600 μm. Note that, for the purpose of comparison to the present example, the reflective film 14 with the coating paste application area and the application amount changed was formed as a comparative example.

Next, results of comparison between the present example and the comparative example are shown.

In the present example, the coating paste was applied only to the top surface of the scintillation layer 13 without applying the coating paste to side surfaces, thereby forming the reflective film 14. In this case, as shown in FIG. 28, peeling of the scintillation layer 13 of CsI:Tl did not occur until the reflective film thickness exceeded 200 μm.

Figures 29, 30:
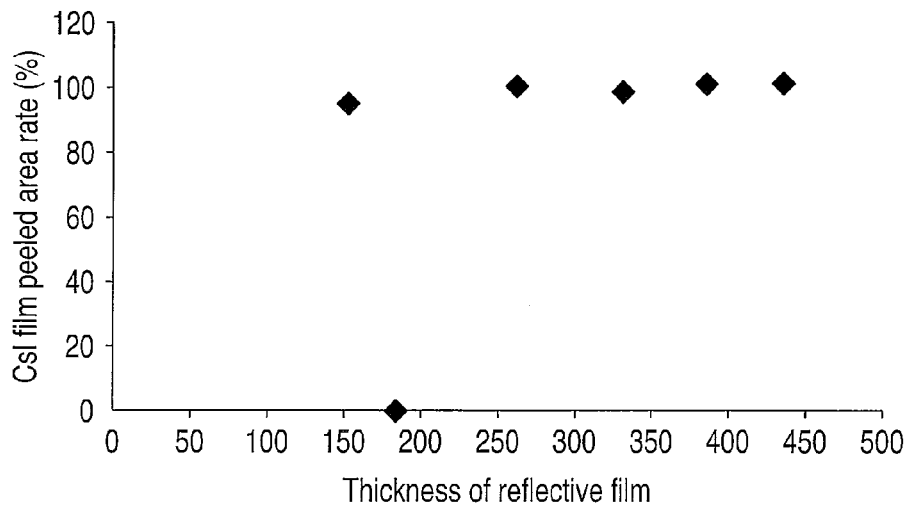
FIG. 29 shows the eleventh example, and particularly is a graph showing results of examining a relationship between the thickness of a reflective film and the peeling of a scintillation layer in the case where the reflective film is applied up to side surfaces of the scintillation layer.
FIG. 30 shows a twelfth example of the embodiment, and particularly shows, in a table, results of examining characteristics of luminance and resolution by a reflective film method.

On the other hand, in the comparative example, a coating paste was applied to the top surface and side surfaces of the scintillation layer 13 to form the reflective film 14. In this case, as shown in FIG. 29, peeling of the scintillation layer 13 of CsI:Tl occurred even with a reflective film thickness of about 150 μm. The dependence of this tendency on the solvent adding rate was not particularly observed. As mentioned above, it is presumed that, if the reflective film 14 covers up to side surfaces of the scintillation layer 13, ripping force (force of stripping mode) acts on an end surface of the scintillation layer 13 because of stress due to volume contraction of the reflective film 14 when being dried, causing peeling from the periphery of the scintillation layer 13 to easily occur.

Next, a twelfth example of the present embodiment will be described.

In producing the coating paste of the reflective film 14, coating pastes were manufactured by way of trial using several solvents having different boiling points among solvents for dissolving a binder material. Reflective films formed using these coating pastes were compared. As the light-scattering particles, Rutile-type $TiO_2$ powder having an average particle size of 0.3 μm is used. As the binder material, acrylic resin and butyral resin were used. Solvents for comparison are acetone (approximate boiling point 56° C.), methylcyclohexane (approximate boiling point 101° C.), cyclohexanone (approximate boiling point 156° C.) and the like.

As a result of comparison of the reflective films 14, if a solvent having a low boiling point, such as acetone, is used, the reflective film 14 has a poor smoothness. This is because drying after applying a coating paste is rapid and therefore waviness and coating unevenness produced on the surface of a reflective film during the application are left unchanged. Abrupt drying causes cracking in the reflective film 14 to easily occur.

On the other hand, it was found that if methylcyclohexane and cyclohexanone having high boiling points were used, the reflective film 14 that was excellent in surface smoothness was obtained. This is because drying time after applying the paste is needed but smoothness of the surface of a coated film is improved by the time when the paste is dried. As compared to drying in a short time, cracking is inhibited from occurring. In particular, if cyclohexanone is used, the reflective film 14 that is excellent in surface smoothness is easily obtained. These reflective films 14 excellent in smoothness can reduce luminance irregularity of X-ray images and make cracks difficult to produce. They are therefore also excellent in reliability. If a moisture-proof film (CVD film of polyparaxylylene or the like) 15 is formed on the top surface of the reflective film, the absence of a crack in the reflective film 14 allows the continuity of a moisture-proof film to be ensured, resulting in high moisture-proof performance.

The higher the temperature at the boiling point of a solvent, the higher the smoothness improvement effect of the reflective film 14. Solvents having boiling points approximately greater than or equal to 100° C. can ensure smoothness at a level without any problem with various coating methods such as dispenser, bar coating, contact metal screen printing and brush coating.

Next, processes after forming the reflective films 14 will be described.

After forming the reflective film 14, the moisture-proof film 15 was formed to prevent the scintillation layer 13 from characteristic deterioration caused by moisture absorption. A method of covering the entire surface of the scintillation layer 13 and the reflective film 14 with a thermal CVD film of polyparaxylylene was used when forming the moisture-proof film 15.

Thermal CVD equipment includes a vaporizing chamber, a thermal decomposition chamber, a vapor deposition chamber, an exhaust system and the like. Paraxylylene resin dimers are vaporized in the vaporizing chamber. Thereafter, they are decomposed into radical monomers having a high reactivity in the thermal decomposition chamber, and introduced into a vapor deposition chamber. A sample formed in the reflective film is stocked in the vapor deposition chamber, and paraxylylene introduced as monomers into the vapor deposition chamber is brought into contact with the surface of the sample to be polymerized, depositing as a polymer film. In the present example, parylene C, which has a lower steam permeability among paraxylylene resin, was used, and the thickness of a polyparaxylylene moisture-proof film was approximately 20 μm.

Electrode pad portions and the like in the periphery of the array substrate 12 are protected before the CVD process with a mask tape and the like, and are exposed by a method of removing the mask tape after film formation by CVD.

As moisture-proof methods other than the polyparaxylylene moisture proof, various methods can be applied including a method using a moisture-proof member having a high steam barrier property such as an aluminum laminated film, aluminum foil, a laminated moisture-proof sheet containing an inorganic film and an organic film or a glass plate, and a frame-shaped moisture-proof member arranged in the periphery of the scintillator.

Forming the moisture-proof film 15 allows completion of a panel of the X-ray detector 11. Subsequently, wiring is joined with each electrode pad portion of control lines and signal lines by TAB connection. Each electrode pad portion is connected to a circuit following an amplifier through the wiring. Further, integrating a panel into an enclosure structure results in completion of the X-ray detector 11 of the present example.

Luminance characteristics were evaluated as the major characteristics of the X-ray detector 11 of the present example. The contrast transfer function (CTF) was measured by using a resolution chart to evaluate resolution characteristics. Reflective films in conventional examples for comparison are a reflective film formed by pressing an aluminum reflective plate onto the scintillation layer 13 and a reflective film obtained by forming an Ag—Pt—Cu alloy directly on the scintillator using sputtering deposition. Note that characteristics in the case of using these reflective films in conventional examples were evaluated as in the present example.

These evaluation results are shown in FIGS. 30 and 31. As found from the drawings, in the X-ray detector 11 of the present example, luminance sharply increases and a decrease in resolution is small as compared with characteristics in the case without a reflective film. In an X-ray detector for comparison in which an aluminum reflective plate was used as a reflective film, luminance increases to some extent but a decrease in resolution is large. In an X-ray detector for comparison in which an Ag—Pt—Cu alloy was used as a reflective film, luminance decreases although resolution increases. This is considered to be because, with a pillar structure of a CsI:Tl film, smoothness cannot be obtained in a reflective film by a thin-film deposition method such as vapor deposition or a sputtering method, and therefore the reflection effect cannot sufficiently be exhibited. The reflective film for comparison absorbs fluorescence toward the front surface side of the scintillation layer 13, and therefore resolution increases but luminance is lost. Loss of luminance is fatal to the X-ray detector.

From the above, it is found that the X-ray detector 11 using the reflective film 14 of the present example is excellent in both luminance characteristics and resolution characteristics.

Note that the present invention is not limited to the foregoing embodiment as it is, and can be embodied in its implementation stage by modifying elements without departing from the gist. Also, various inventions can be formed by appropriately combining a plurality of elements disclosed in the foregoing embodiment. For example, several elements may be deleted from all the elements indicated in the embodiment.

For example, the present invention is not limited to an X-ray detector and a method of manufacturing the X-ray detector. The present invention can be applied to any radiation detector and any method of manufacturing the radiation detector.

According to the present invention, in a reflective film, depletion portions not filled with a binder material are formed in the peripheries of light-scattering particles, and therefore a refraction angle is small at an interface between the light-scattering particle and the depletion portion. This causes a reflection effect due to multiple refraction of fluorescence resulting from conversion by a scintillation layer to be generated in a small area. A decrease in resolution and a decrease in luminance caused by distant diffusion of reflection light can be suppressed, and therefore a radiation detector with high resolution and high luminance can be provided.

What is claimed is:

1. A radiation detector comprising:
    a plurality of photoelectric conversion elements;
    a scintillation layer which converts radioactive rays to fluorescence, the scintillation layer being formed on the photoelectric conversion elements; and
    a reflective film formed on the scintillation layer, the reflective film containing light-scattering particles for reflecting the fluorescence from the scintillation layer and a binder material binding the light-scattering particles, and having depletion portions without being filled with the binder material, the depletion portions being formed in a periphery of the light-scattering particles, wherein the reflective film satisfies a relationship of a volume filling ratio of the light-scattering particles to the binder material (a volume of the light-scattering particles/a volume of the binder material)$\geq 4/6$.

2. The radiation detector according to claim 1, wherein the scintillation layer has a pillar structure, and some of the light-scattering particles in the reflective film are positioned on the scintillation layer, and penetrate into the pillar structure of the scintillation layer.

3. The radiation detector according to claim 1, wherein a main component of the binder material is butyral resin.

4. The radiation detector according to claim 1, wherein a volume occupying rate of the light-scattering particles in the reflective film is larger on a side close to the scintillation layer than on a side close to a surface layer of the reflective film.

5. The radiation detector according to claim 1, wherein the reflective film satisfies a relationship of an average size of the light-scattering particles/a volume filling factor of the light-scattering particles$\leq 1/10 \times$a film thickness.

6. The radiation detector according to claim 1, wherein the scintillation layer has a pillar structure, and an average size of the light-scattering particles of the reflective film is one fourth or less of an inter-column average pitch of the pillar structure of the scintillation layer.

7. The radiation detector according to claim 1, wherein an average size of the light-scattering particles of the reflective film is within a range of one tenth to ten times of a maximum light-emitting wavelength of the scintillation layer.

8. The radiation detector according to claim 1, wherein the photoelectric conversion elements are arranged at a certain pitch, and the reflective film has a thickness less than or equal to the pitch of the photoelectric conversion elements.

9. The radiation detector according to claim 1, wherein the reflective film contains an optical absorptive filler material for absorbing at least part of a fluorescent spectral component emitted by the scintillation layer.

10. The radiation detector according to claim 1, wherein the reflective film covers a surface of the scintillation layer with a certain thickness when covering a top surface and a thinner (or zero) thickness when covering a side or near-edge surface of the scintillation layer.

11. A method of manufacturing a radiation detector comprising:

forming a plurality of photoelectric conversion elements on a substrate;

forming a scintillation layer on the photoelectric conversion elements; and applying a coating paste to the scintillation layer and thereafter drying the coating paste, the coating paste being obtained by stirring and mixing light-scattering particles, a binder material binding the light-scattering particles, and a solvent having a boiling point of 100° C. or more for dissolving the binder material, to form a reflective film having a depletion portion without being filled with the binder material, the depletion portion being formed in a periphery of the light-scattering particles.

* * * * *